(12) United States Patent
Gaevski et al.

(10) Patent No.: US 9,660,043 B2
(45) Date of Patent: *May 23, 2017

(54) OHMIC CONTACT TO SEMICONDUCTOR LAYER

(71) Applicant: Sensor Electronic Technology, Inc., Columbia, SC (US)

(72) Inventors: Mikhail Gaevski, West Columbia, SC (US); Grigory Simin, Columbia, SC (US); Maxim S. Shatalov, Columbia, SC (US); Alexander Dobrinsky, Loudonville, NY (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/636,546

(22) Filed: Mar. 3, 2015

(65) Prior Publication Data

US 2015/0179751 A1 Jun. 25, 2015

Related U.S. Application Data

(63) Continuation-in-part of application No. 13/909,621, filed on Jun. 4, 2013, now Pat. No. 8,969,198.

(Continued)

(51) Int. Cl.
*H01L 29/45* (2006.01)
*H01L 29/20* (2006.01)
(Continued)

(52) U.S. Cl.
CPC ...... *H01L 29/452* (2013.01); *H01L 21/28575* (2013.01); *H01L 21/28587* (2013.01);
(Continued)

(58) Field of Classification Search
None
See application file for complete search history.

(56) References Cited

U.S. PATENT DOCUMENTS 6,946,682 B2    9/2005    Slater et al.
7,601,993 B2    10/2009    Hoshi et al.
(Continued)

FOREIGN PATENT DOCUMENTS

KR    101990039343    6/1999
KR    1020060040422    5/2006
(Continued)

OTHER PUBLICATIONS

WO2011/074166, Kajitani, Jun. 23, 2011.*
(Continued)

*Primary Examiner* — Benjamin Sandvik
(74) *Attorney, Agent, or Firm* — LeBatt, LLC

(57) ABSTRACT

A perforating ohmic contact to a semiconductor layer in a semiconductor structure is provided. The perforating ohmic contact can include a set of perforating elements, which can include a set of metal protrusions laterally penetrating the semiconductor layer(s). The perforating elements can be separated from one another by a characteristic length scale selected based on a sheet resistance of the semiconductor layer and a contact resistance per unit length of a metal of the perforating ohmic contact contacting the semiconductor layer. The structure can be annealed using a set of conditions configured to ensure formation of the set of metal protrusions.

12 Claims, 14 Drawing Sheets

Related U.S. Application Data

(60) Provisional application No. 61/655,437, filed on Jun. 4, 2012.

(51) Int. Cl.

| | |
|---|---|
| H01L 21/285 | (2006.01) |
| H01L 29/417 | (2006.01) |
| H01L 33/38 | (2010.01) |
| H01L 29/778 | (2006.01) |

(52) U.S. Cl.
CPC .... *H01L 21/28593* (2013.01); *H01L 29/2003* (2013.01); *H01L 29/4175* (2013.01); *H01L 29/41766* (2013.01); *H01L 33/382* (2013.01); *H01L 29/7787* (2013.01); *H01L 2933/0016* (2013.01)

(56) References Cited

U.S. PATENT DOCUMENTS

| | | | |
|---|---|---|---|
| 7,923,753 B2 | 4/2011 | Mita et al. | |
| 8,525,227 B2* | 9/2013 | Jeon | B82Y 10/00 257/192 |
| 8,604,511 B2 | 12/2013 | Bennett et al. | |
| 8,735,941 B2* | 5/2014 | Park | H01L 29/41766 257/194 |
| 8,941,146 B2* | 1/2015 | Kanamura | H01L 21/28587 257/192 |
| 8,969,198 B2* | 3/2015 | Gaevski | H01L 21/768 257/76 |
| 2002/0142548 A1 | 10/2002 | Takaishi | |
| 2007/0187677 A1 | 8/2007 | Park et al. | |
| 2008/0173898 A1* | 7/2008 | Ohmaki | H01L 27/0605 257/194 |
| 2008/0217625 A1* | 9/2008 | Kuroda | H01L 29/045 257/76 |
| 2008/0258150 A1 | 10/2008 | McCarthy et al. | |
| 2009/0035884 A1 | 2/2009 | Ikuta | |
| 2009/0127575 A1 | 5/2009 | Horng et al. | |
| 2009/0212276 A1 | 8/2009 | Hong et al. | |
| 2010/0059781 A1 | 3/2010 | Yokobayashi et al. | |
| 2011/0018024 A1 | 1/2011 | Fukshima et al. | |
| 2011/0143507 A1 | 6/2011 | Mun et al. | |
| 2011/0198641 A1 | 8/2011 | Yahata et al. | |
| 2011/0233520 A1* | 9/2011 | Jeon | B82Y 10/00 257/20 |
| 2011/0233596 A1 | 9/2011 | Sano et al. | |
| 2012/0049152 A1 | 3/2012 | Schubert | |
| 2012/0235204 A1 | 9/2012 | Hodota et al. | |
| 2012/0248500 A1* | 10/2012 | Kajitani | H01L 29/045 257/183 |
| 2013/0026519 A1 | 1/2013 | Huang et al. | |
| 2013/0320352 A1 | 12/2013 | Gaevski et al. | |
| 2014/0016660 A1 | 1/2014 | Lunev et al. | |
| 2014/0264454 A1* | 9/2014 | Banerjee | H01L 29/7786 257/194 |

FOREIGN PATENT DOCUMENTS

| | | |
|---|---|---|
| KR | 100786091 B1 | 12/2007 |
| KR | 100826375 B1 | 5/2008 |

OTHER PUBLICATIONS

WIPO translation of WO2011/074166.*
Google translation of WO2011/074166.*
Selvaraj et al., "AlN/AlGaN/GaN MIS-HEMTs with recessed source/drain Ohmic contact", physica status solidi, Jul. 2008, pp. 2988-2990, vol. 5, No. 9.
Ahn et al., "30-nm recessed S/D SOI MOSFET with an ultrathin body and a low SDE resistance", IEEE Electron Device Letters, Jul. 2005, pp. 486-488, vol. 26, No. 7.
Zhang et al., "Self-Align Recessed Source Drain Ultrathin Body SOI MOSFET", IEEE Electron Device Letters, Nov. 2004, pp. 740-742, vol. 25, No. 11.
Ke et al., "Recessed source/drain for sub-50 nm UTB SOI MOSFET", Semiconductor Science and Technology, May 2007, pp. 577-583, vol. 22, No. 5.
Chen et al, "High-transconductance self-aligned AlGaN/GaN modulation-doped field-effect transistors with regrown ohmic contacts", Applied Physics Letters, 1998, pp. 3147-3149, vol. 73, No. 21.
Zopler et al., "Ion-implanted GaN junction field effect transistor", Applied Physics Letters, 1996, pp. 2273-2275, vol. 68, No. 16.
Song et al., "Ohmic-Contact Technology for GaN-Based Light-Emitting Diodes: Role of P-Type Contact", IEEE Trans. Electron Devices, Jan. 2010, pp. 42-59, vol. 57, No. 1.
Choi, International Search Report and Written Opinion for International Application No. PCT/US2013/0044065, Sep. 6, 2013, 9 pages
Rodela, Office Action for U.S. Appl. No. 13/940,515, Jul. 10, 2014, 29 pages.
White, Notice of Allowance for U.S. Appl. No. 13/909,621, Oct. 8, 2014, 14 pages.
Rodela, Final Office Action for U.S. Appl. No. 13/940,515, Jan. 30, 2015, 22 pages.
Chiu, C.H. et al., "Fabrication and characteristics of thin-film InGaN—GaN light-emitting diodes with TiO2/SiO2 omnidirectional reflectors," Semiconductor Science and Technology, Jul. 2007, 6 pages, vol. 22, No. 7.
Gessmann et al., "GaInN light-emitting diodes with omnidirectional reflectors", 2003, 6 pages, vol. 4996.
Gessmann et al., "High-efficiency AlGaInP light-emitting diodes for solid-state lighting applications," J. Appl. Phys., 2004, 15 pages, vol. 95, No. 5.
Hong-Xia, M. et al., "A Novel Ni/Ag/Pt Ohmic Contact to P-Type GaN for Flip-Chip Light-Emitting Diodes," Chinese Phys. Lett., Aug. 2006, 5 pages, vol. 23, No. 8.
Huang H.W. et al., "High-Performance GaN-Based Vertical-Injection Light-Emitting Diodes With TiO2—SiO 2 Omnidirectional Reflector and n-GaN Roughness," IEEE Photonics Technology Letters, 2007, 3 pages, vol. 19, No. 8.
Huang, H.W. et al., "Improvement of light output in GaN-based power chip light-emitting diodes with a nano-rough surface by nanoimprint lithography," Semicond. Sci. Technol., Apr. 2008, 5 pages, vol. 23, No. 4.
Jang, J. et al., "Low-resistance and thermally stable indium tin oxide Ohmic contacts on strained p-In0.15Ga0.85N/pGaN layer," Journal of Applied Physics, 2007, 5 pages, vol. 101, No. 1.
Kim, J. et al., "Enhanced light-extraction in GaInN near-ultraviolet light-emitting diode with Al-based omnidirectional reflector having NiZn/Ag microcontacts," Applied Physics Letters, 2006, 4 pages, vol. 89, No. 14.
Kim, J. et al., "GaInN light-emitting diode with conductive omni-directional reflector having a low-refractive-index indium-tin oxide layer," Applied Physics Letters, 2006, 4 pages, vol. 88, No. 1.
Kim, J. et al., "GaInN light-emitting diodes with RuO2/SiO2/Ag omni-directional reflector", Applied Physics Letters, 2004, 3 pages, vol. 84, No. 22.
Lee, C. et al., "Effects of strained InGaN interlayer on contact resistance between p-GaN and indium tin oxide," Applied Physics Letters, 2007, 4 pages, vol. 90, No. 18.
Lee, W. et al., "Enhanced Light Output of Vertical-Structured GaN-Based Light-Emitting Diodes with TiO2/SiO2 Reflector and Roughened GaOx Surface Film," Japanese Journal of Applied Physics, Apr. 2011, 4 pages, vol. 50, No. 4.
Lin, C.H. et al., "Enhancement of InGaNGaN Indium-Tin-Oxide Flip-Chip Light-Emitting Diodes With TiO_2-O_2Multilayer Stack Omnidirectional Reflector", IEEE Photonics Technology Letters, Oct. 2006, 3 pages, vol. 18, No. 19.
Peng, L. et al., "GaN-Based LEDs With GaN-Pillars Around Mesa, Patterned Substrate, and Reflector Under Pads," IEEE Photonics Technology Letters, Nov. 15, 2009, 3 pages, vol. 21, No. 22.
Schubert, M. et al., "Distributed Bragg reflector consisting of high- and low-refractive-index thin film layers made of the same material," Applied Physics Letters, 2007, 3 pages, vol. 90, No. 14.

(56) References Cited

OTHER PUBLICATIONS

Schubert, E. et al., "Solid-state lighting-a benevolent technology," Rep. Prog. Phys., Dec. 2006, 31 pages, vol. 69, No. 12.
Sheu, J. K. et al., "Enhancement in output power of blue gallium nitride-based light-emitting diodes with omnidirectional metal reflector under electrode pads," Applied Physics Letters, 2008, 4 pages, vol. 93, No. 10.
Wang, T. et al., "Highly improved performance of a 350nm ultraviolet light-emitting diode containing AlxGa1-xN/AlyGa1-yN distributed Bragg reflectors," Journal of Crystal Growth, Jul. 2004, 5 pages, vol. 267, No. 3-4.
Xie, Z.L. et al., "High reflectivity AlGaN/AlN DBR mirrors grown by MOCVD," Journal of Crystal Growth, Jan. 2007, 4 pages, vol. 298.
Yamada, M. et al., "InGaN-Based Near-Ultraviolet and Blue-Light-Emitting Diodes with High External Quantum Efficiency Using a Patterned Sapphire Substrate and a Mesh Electrode," Dec. 2002, 3 pages, vol. 41, No. Part 2, No. 12B.
Yan-Xu, Z. et al., "Flip-Chip GaN-Based Light-Emitting Diodes with Mesh-Contact Electrodes," Jan. 2007, 4 pages, vol. 24, No. 1.
Zhu, Y. et al., "Enhanced output of GaN-based light-emitting diodes with stripe-contact electrodes," Applied Physics Letters, 2006, 4 pages, vol. 89, No. 8.
Rodela, E., U.S. Appl. No. 13/940,515, Notice of Allowance, Dec. 8, 2015, 15 pages.
Rodela, E., U.S. Appl. No. 13/940,515, Office Action 2, Jul. 2, 2015, 24 pages.
Park., International Search Report and Written Opinion for International Application No. PCT/US2013/050215, Sep. 26, 2013, 13 pages.
Rodela, E., U.S. Appl. No. 14/984,511, Office Action 1, Jan. 3, 2017, 23 pages.

\* cited by examiner

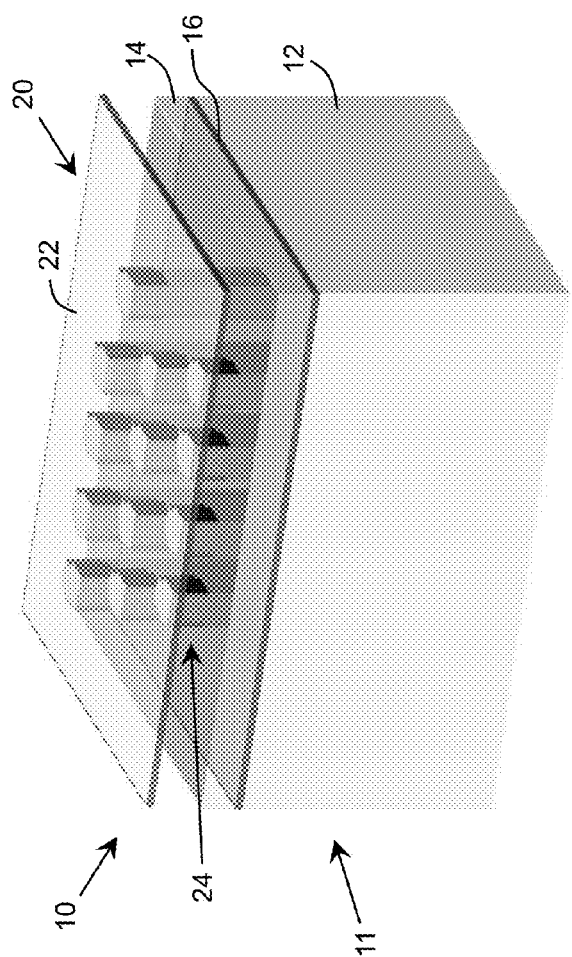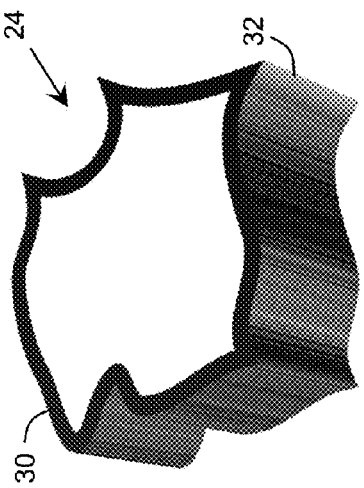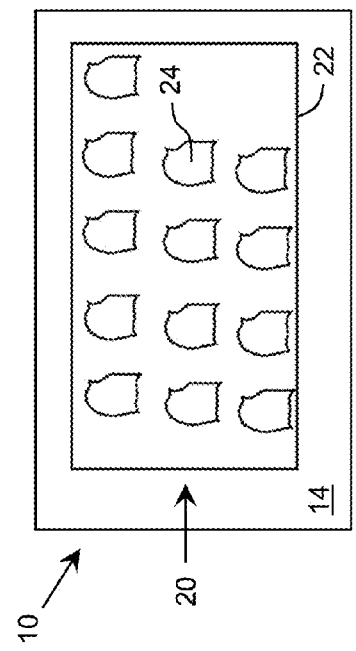

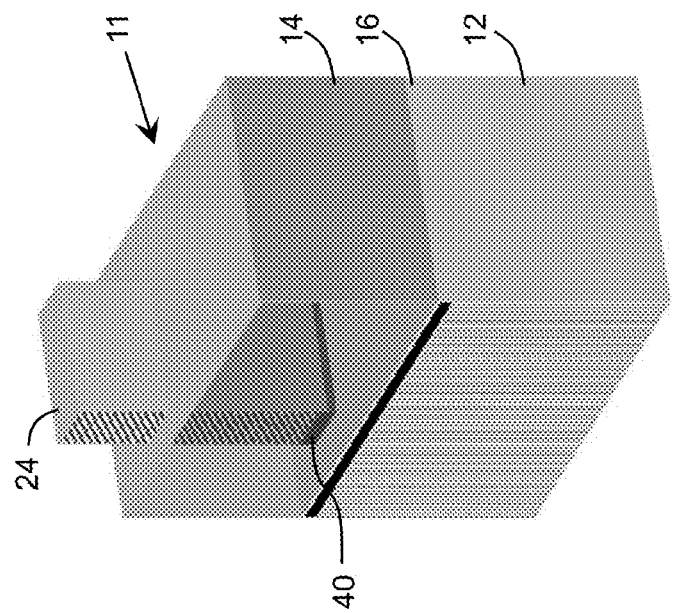
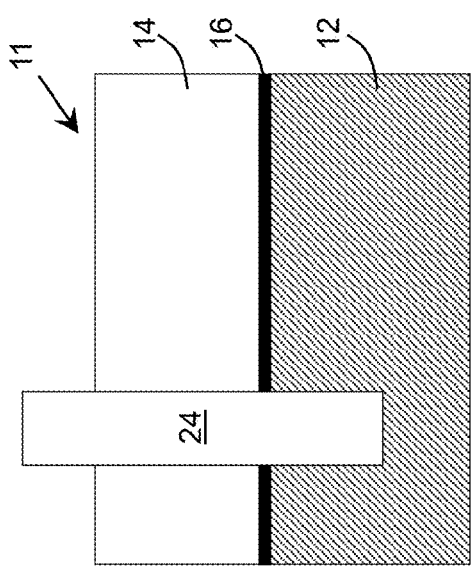

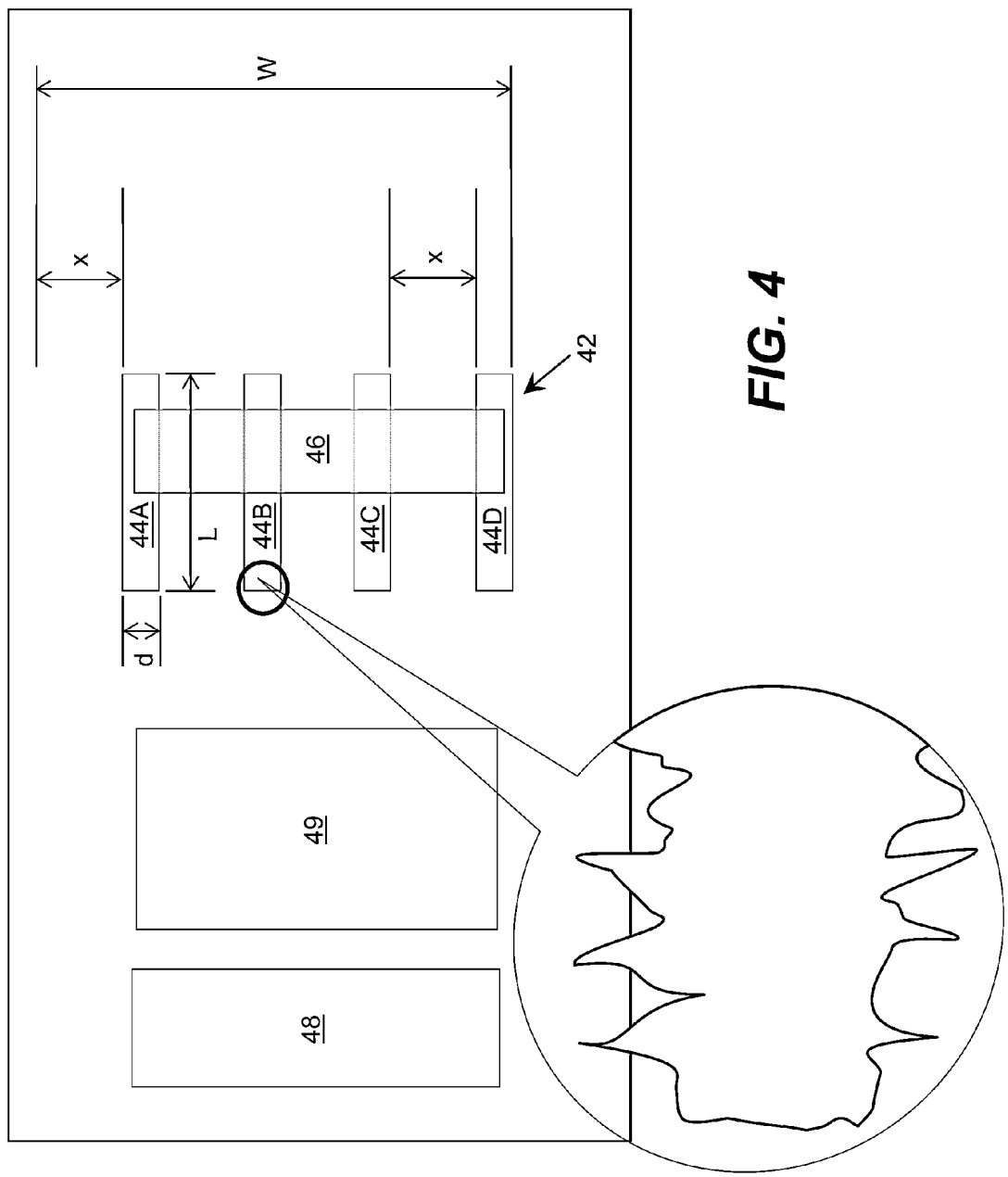

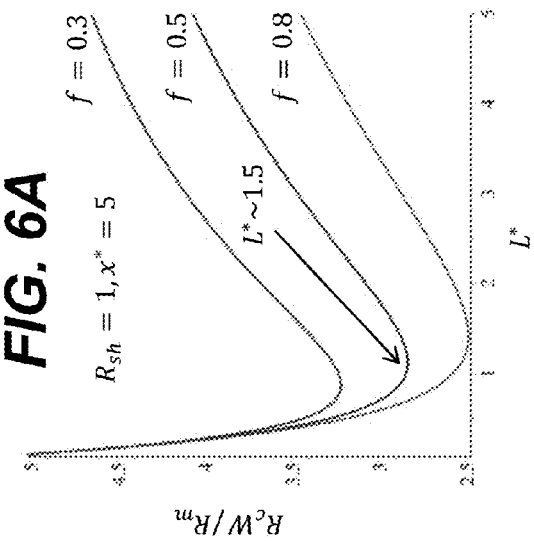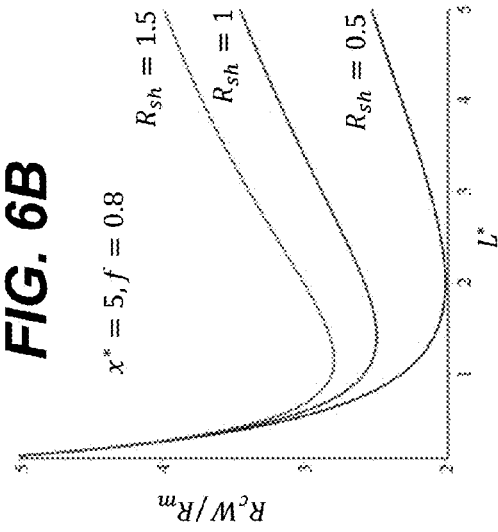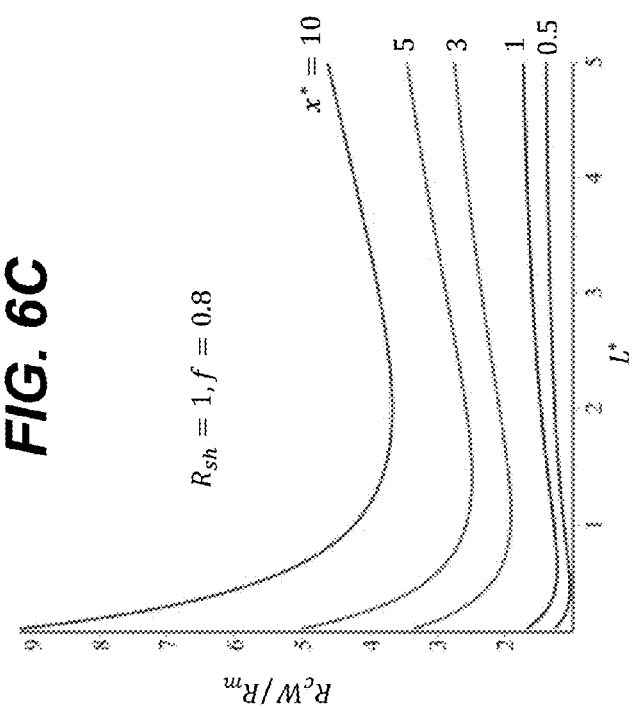

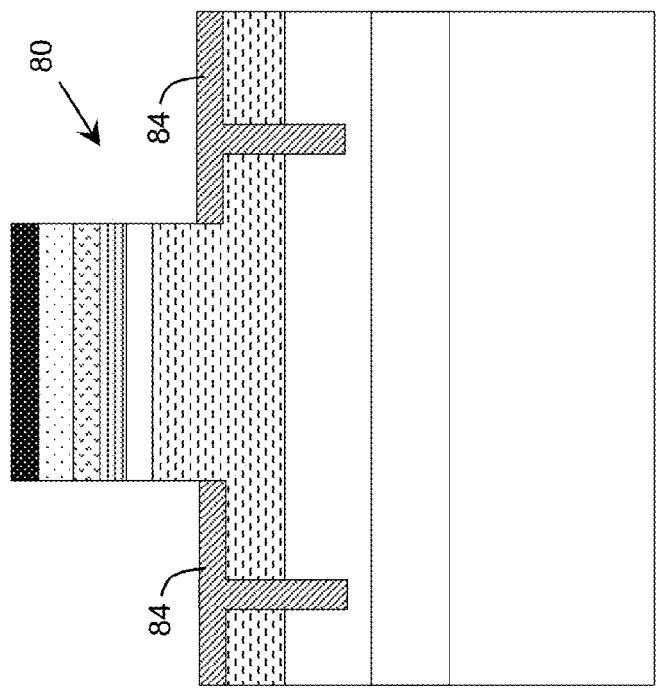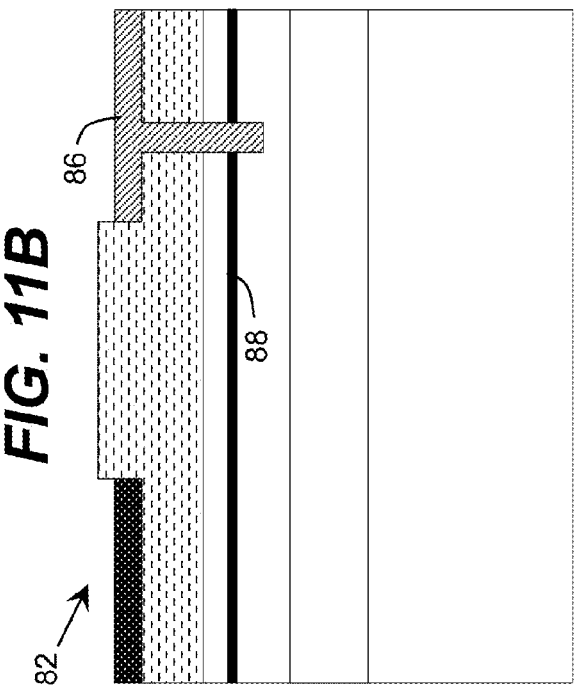

OHMIC CONTACT TO SEMICONDUCTOR LAYER

REFERENCE TO RELATED APPLICATIONS

The current application is a continuation-in-part of U.S. application Ser. No. 13/909,621, filed 4 Jun. 2013, which issued as U.S. Pat. No. 8,969,198 on 3 Mar. 2015, and which claims the benefit of U.S. Provisional Application No. 61/655,437, titled "Ohmic Contact to Semiconductor Layers," which was filed on 4 Jun. 2012, both of which are hereby incorporated by reference.

TECHNICAL FIELD

The disclosure relates generally to ohmic contacts, and more particularly, to an improved method of manufacturing an ohmic contact to a semiconductor layer.

BACKGROUND ART

Developing a good ohmic contact to a semiconductor layer is critical for the operation, stability, and lifetime of the corresponding semiconductor device. Various approaches have been employed to form ohmic contacts. One approach, which can produce a good ohmic contact to a semiconductor layer, uses an annealing process. For example, titanium/aluminum (Ti/Al) is frequently used as an ohmic contact to n-doped nitride semiconductor layers. In this case, a titanium nitride (TiN) layer creates N vacancies in the underlying aluminum gallium nitride/gallium nitride (AlGaN/GaN) structure, which effectively dopes the material. Frequently, nickel (Ni) also is added to prevent diffusion and oxidation of the Ti/Al.

Another approach includes etching semiconductor layers and planting the ohmic contact into the etched cavity. For example, in one approach, recessed ohmic contacts are disclosed where a semiconductor device is formed by engineering a channel-forming layer grown on a semiconductor substrate with subsequent deposition of a Schottky layer. In this approach, the two dimensional electron gas (2DEG) is established at an interface between the Schottky layer and the channel-forming layer. Furthermore, in this approach, a gate electrode is formed on the Schottky layer via a cap layer and a recess-structured ohmic electrode is in ohmic contact with the 2DEG layer.

A similar technique has been used for Metal-Insulator-Semiconductor (MIS) high electron mobility transistors (HEMT). In this case, an insulating two nanometer thick AlN layer is removed and source and drain contacts are recessed. Contrary to the previous approach, the source and drain contacts are not recessed all the way to the 2DEG layer.

Recessed source and drain contacts also have been investigated in the context of transistor devices. Results have shown that a recessed source/drain structure can provide an ohmic contact with a much lower source/drain resistance than a conventional elevated source/drain contact. Furthermore, the recessed source/drain contact can reduce parasitic gate to source/drain capacitance over the conventional approach. A drawback of the recessed source and drain contacts is a presence of a short channel effect, which can deteriorate the device performance.

A recessed ohmic contact is useful as a way to access the 2DEG. A 2DEG is typically utilized in a HEMT, where the current path is formed at an interface between two types of semiconductor film having different band gaps. In order to support the 2DEG, the semiconductor layers typically comprise a channel-forming layer formed on a substrate and another layer forming a heterojunction with the channel-forming layer. For example, a GaN film can be used as the channel-forming layer, and an AlGaN film can be used as the layer forming the heterojunction with the channel-forming layer.

A recessed ohmic contact also is beneficial in cases when semiconductor layers do not support 2DEG, such as an ohmic contact formed for a light emitting device (LED). In this case, the recessed ohmic contact allows for a larger contact-to-semiconductor junction area, and as a result, a lower contact resistance.

Other approaches to reduce the ohmic contact resistance for AlGaN/GaN based HEMTs, for example, utilize a highly doped n+ cap GaN layer or selective implantation of silicon (Si) near the source and drain contacts.

Approaches for forming ohmic contacts are very different for n- and p-type contacts. For n-type contacts to n-type GaN, for example, the ohmic contacts are formed using a metal work function that is smaller than that of the n-type GaN based semiconductor. A frequently used metal is Ti, which has a work function, $\phi_m$=4.33 eV. For Ti-based contacts to n-type GaN, which has a carrier concentration of 5 to $7\times10^{18}$ cm$^{-3}$, low contact resistances ranging from $10^{-5}$ to $10^{-8}$ $\Omega$cm$^2$ have been obtained.

Making a p-type contact to p-type GaN, for example, is much more difficult. In particular, it is difficult to grow well doped p-type GaN with a carrier concentration of more than $10^{18}$ cm$^{-3}$ due to a high activation energy of acceptors. Additionally, it is difficult to find metals with a work function that corresponds to p-type GaN. Metals with a large work function, such as Ni, are typically used to form ohmic p-type contacts. The details of annealing are an important factor for contact performance. Various annealing approaches have been proposed, including annealing in air or oxygen to improve contact performance. Other approaches to improve the performance of an ohmic contact include various methods of treating a semiconductor surface. The possible methods include plasma and laser treatment. In addition, use of superlattices, strained semiconductor layers, and spontaneous polarization have been employed to achieve a high hole concentration and result in a low contact resistivity.

SUMMARY OF THE INVENTION

Aspects of the invention provide a perforating ohmic contact to a semiconductor layer in a semiconductor structure. Other aspects provide an essentially linear perforating ohmic contact to a semiconductor layer in a semiconductor structure. The perforating ohmic contact can include a set of perforating elements, which can include a set of metal protrusions laterally penetrating the semiconductor layer(s). The perforating elements can be separated from one another by a characteristic length scale selected based on a sheet resistance of the semiconductor layer and a contact resistance per unit length of a metal of the perforating ohmic contact contacting the semiconductor layer. The structure can be annealed using a set of conditions configured to ensure formation of the set of metal protrusions.

A first aspect of the invention provides a method comprising: fabricating a perforating ohmic contact to a semiconductor layer in a semiconductor structure, the fabricating including: forming a plurality of cavities in the semiconductor structure, wherein the plurality of cavities are separated from each other by a characteristic length scale, and wherein the characteristic length scale is selected based on a sheet resistance of the semiconductor layer and a contact resistance per unit length of a metal of the perforating ohmic contact contacting the semiconductor layer; depositing the metal into the plurality of cavities and over an area of the semiconductor structure including the plurality of cavities; and annealing the semiconductor structure and the metal using a set of conditions configured to ensure formation of a set of metal protrusions laterally penetrating the semiconductor layer from at least one of the plurality of cavities, wherein the set of metal protrusions are conducive to at least one of: field emission or field-enhanced thermionic emission.

A second aspect of the invention provides a device comprising: a semiconductor structure including a semiconductor layer; and a perforating ohmic contact to the semiconductor layer, the perforating ohmic contact including: a plurality of perforating elements formed of a metal deposited in a plurality of cavities in the semiconductor structure, wherein the plurality of cavities are separated from each other by a characteristic length scale selected based on a sheet resistance of the semiconductor layer and a contact resistance per unit length of the metal, and wherein at least one of the plurality of perforating elements includes a set of metal protrusions laterally penetrating the semiconductor layer conducive to at least one of: field emission or field-enhanced thermionic emission; and a top layer of the metal located over an area of the semiconductor structure including the plurality of cavities.

A third aspect of the invention provides a method of fabricating a device, the method comprising: forming a perforating ohmic contact to a semiconductor layer or a semiconductor structure, the perforating ohmic contact including: a plurality of perforating elements formed of a metal deposited in a plurality of cavities in the semiconductor structure, wherein the plurality of cavities are separated from each other by a characteristic length scale selected based on a sheet resistance of the semiconductor layer and a contact resistance per unit length of the metal, and wherein at least one of the plurality of perforating elements includes a set of metal protrusions laterally penetrating the semiconductor layer, wherein the set of metal protrusions are conducive to at least one of: field emission or field-enhanced thermionic emission; and a top layer of the metal located over an area of the semiconductor structure including the plurality of cavities.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 1A-1C show a portion of an illustrative device according to an embodiment.

FIGS. 3A and 3B show an illustrative perforating element in a semiconductor structure according to an embodiment.

FIG. 4 shows an illustrative geometrical model for calculating a resistance of a perforating ohmic contact according to an embodiment.

FIG. 6A-6C show dependence plots of normalized contact resistance on the contact length subject to various physical parameters according to an embodiment.

FIGS. 11A and 11B show side views of an illustrative light emitting device and an illustrative transistor according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 2A:
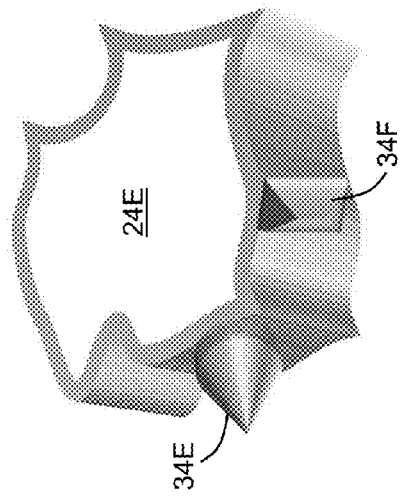
FIGS. 2A-2E show shapes and scales of illustrative protrusions forming sharp edges according to embodiments.
Figure 2B:
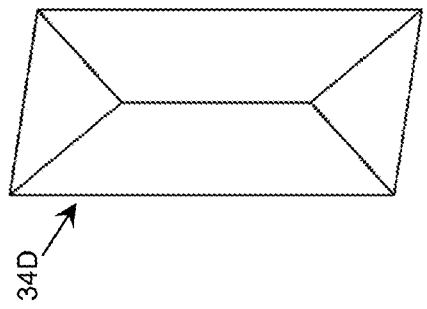
Figure 2C:
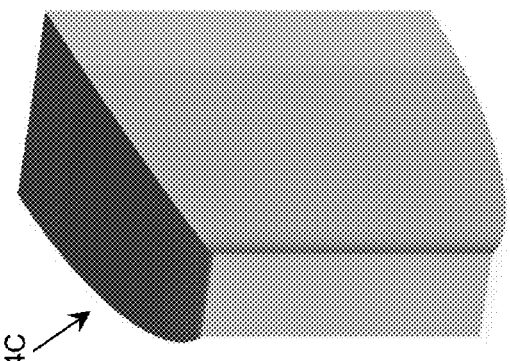
Figure 2D:
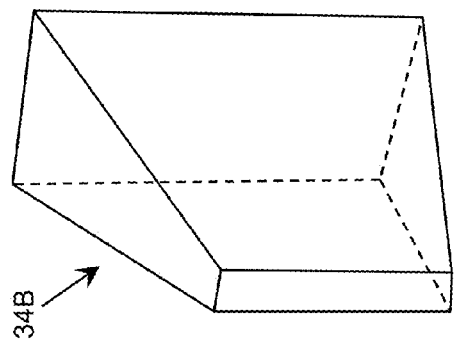

As indicated above, aspects of the invention provide a perforating ohmic contact to a semiconductor layer in a semiconductor structure. Other aspects provide an essentially linear perforating ohmic contact to a semiconductor layer in a semiconductor structure. A perforating ohmic contact described herein is "essentially linear" when the contact has a mostly (i.e., within +/−10%) linear dependence of current with applied voltage. As used herein, the terms "essentially linear" or "ohmic" are used to refer to perforating contacts having the mostly linear dependence of current with applied voltage. The perforating ohmic contact can include a set of perforating elements, which can include a set of metal protrusions laterally penetrating the semiconductor layer(s). The perforating elements can be separated from one another by a characteristic length scale selected based on a sheet resistance of the semiconductor layer and a contact resistance per unit length of a metal of the perforating ohmic contact contacting the semiconductor layer. The structure can be annealed using a set of conditions configured to ensure formation of the set of metal protrusions. As used herein, unless otherwise noted, the term "set" means one or more (i.e., at least one) and the phrase "any solution" means any now known or later developed solution.

A perforating ohmic contact described herein includes a plurality of perforating elements, which penetrate (e.g., are recessed into) one or more semiconductor layers located below the perforating ohmic contact. The perforating elements can have sharp edges, and when the perforating ohmic contact is to a two-dimensional carrier gas, the perforating elements can be sufficiently deep to penetrate the layers containing the two-dimensional carrier gas. In this manner, the perforating ohmic contact can provide a lower contact resistivity than a regular annealed contact and/or reduce current crowding in the device (e.g., high electron mobility transistor (HEMT), a light emitting diode (LED), and/or the like).

Turning to the drawings, FIGS. 1A-1C show a portion of an illustrative device 10 according to an embodiment. In particular, FIG. 1A shows a perspective view and FIG. 1B shows a top view of the device 10. The device 10 includes a semiconductor structure 11 including semiconductor layer 12 and a second semiconductor layer 14, and a two dimensional carrier (electron or hole) gas 16 formed at a heterojunction of the layers 12, 14.

In an embodiment, the semiconductor structure 11 is a group III-V materials based semiconductor structure 11, in which some or all of the various layers are formed of elements selected from the group III-V materials system. In a more particular illustrative embodiment, the various layers of the semiconductor structure 11 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

The device 10 also is shown including a perforating ohmic contact 20. The contact 20 includes a metallic layer 22 and a plurality of perforating elements 24 (e.g., recessed electrodes). As illustrated, the plurality of perforating elements 24 extend entirely through the layer 14 and the two-dimensional carrier gas 16 and at least partially extend into the layer 12. The metallic layer 22 connects at least a portion of the plurality of perforating elements 24 to one another. As a result, the layer 22 and the perforating elements 24 together form the perforating ohmic contact 20. While aspects of the invention are described in conjunction with a pair of layers 12, 14 and a two-dimensional carrier gas 16 formed there between, it is understood that the semiconductor structure 11 can include any number of layers between the metallic layer 22 and the layer 14. These layer(s) can be configured to provide any desired functionality during operation of the corresponding device 10, including for example, a layer of low conductive material, an isolating layer of material, a barrier layer, a passivation layer, a protective coating, a reflective coating, an antireflective coating, and/or the like.

FIG. 1C shows a more detailed view of a perforating element 24 according to an embodiment. As illustrated, the perforating element 24 has a perimeter 30 that is generally not smooth can includes a set of sharp edges 32. The sharp edges 32 can lead to an increased conductance and an overall improvement in the performance of the perforating ohmic contact 20. As described herein, the perimeter 30 including the sharp edges 32 can be formed from a set of metal protrusions (bulges) laterally extending from the perforating element 24 and penetrating a corresponding semiconductor layer (e.g., layers 12, 14 of FIG. 1A). These metal protrusions can make the perimeter 30 a complex shape and increase the periphery of the perforating element 24.

FIGS. 2A-2E show shapes and scales of illustrative protrusions 34A-34D forming sharp edges according to embodiments. In particular, FIGS. 2A-2D shows illustrative protrusions 34A-34D, including a frustum 34A (resembling a cone), a rectangular frustum 34B (resembling a pyramid), a rectangular frustum 34C having sloping sides, and a triangular prism 34D. However, it is understood that these are only illustrative shapes for protrusions 34A-34D, and a protrusion can have any geometric shape, including any complex and/or irregular geometric shape.

Figure 2E:
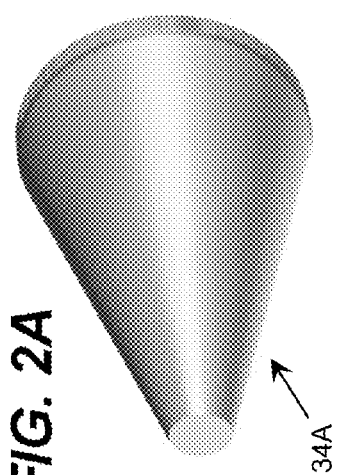

As shown in FIG. 2E, a protrusion, such as the protrusions 34E, 34F shown therein, can comprise a side bulge from a perforating element 24E. In an embodiment, a protrusion can have a bottom base, which is adjacent to the corresponding perforating element 24E, and a top base, which is at an end located furthest from the corresponding perforating element 24E in the semiconductor layer. In this case, the top base can have a cross section that is smaller than a cross section of the bottom base. Furthermore, a characteristic lateral size of the protrusion can be greater than or equal to one half of the Bohr radius in the corresponding semiconductor layer and/or the two-dimensional carrier gas region. Additionally, the characteristic lateral size of the protrusion can be less than a characteristic length scale separating the perforating element 24E from one or more adjacent perforating elements.

Returning to FIGS. 1A-1C, the device can be fabricated using any solution. Initially, the semiconductor structure 11 can be fabricated using any solution. For example, the semiconductor structure 11 can comprise a group III nitride based heterostructure. In this case, fabrication of the semiconductor structure can include: growing an AlN buffer layer on a substrate, such as sapphire; growing an GaN layer 12 above the buffer layer; and growing an AlGaN layer 14 above the GaN layer 12. In this case, the semiconductor layer 12 having a high gallium content is capped with a layer of high aluminum content to form the two-dimensional carrier gas 16 at the heterojunction of the layers 12, 14. As described herein, the two-dimensional carrier gas 16 can comprise an electron gas or a hole gas. In general, all aspects of the invention described herein are applicable to both two-dimensional electron and hole gases.

Subsequently, the perforating ohmic contact 20 can be formed. To this extent, a plurality of cavities can be formed in the semiconductor structure 11, e.g., using an etching process. The plurality of cavities can have a depth that is deeper than a thickness of the semiconductor layer 14, thereby obtaining access to the two-dimensional carrier gas 16. A typical depth of the cavities can be few tens of nanometers. The plurality of cavities can be formed in any pattern and spacing. In an embodiment, the plurality of cavities are separated from each other by a characteristic length scale. The characteristic length scale can be selected based on a sheet resistance of the semiconductor layer 14 and a contact resistance per unit length of a metal to be used for the perforating ohmic contact 20. In an embodiment, the plurality of cavities are formed using a multi-step etching process. For example, plasma assisted etching can be used during a first etching step, which is followed by wet etching during a second etching step. Wet etching can utilize, for example, hydrofluoric acid, which can selectively etch along grain boundaries, dislocations, and other lattice defects, resulting in a non-uniform and complex etched relief. Such a relief can promote formation of an increased number of electrode protrusions during subsequent formation of the perforating ohmic contact 20.

After formation of the cavities, a metal for the perforating ohmic contact 20 can be deposited into the cavities to form the plurality of perforating elements 24 and over an area of the semiconductor structure 11 including the cavities to form the metallic layer 22 using any solution. Depending on a type of ohmic contact desired, different metals can be chosen for the perforating ohmic contact 20. For example, titanium/aluminum (Ti/Al) can be used to form a perforating ohmic contact 20 to an n-doped nitride semiconductor layer. For a p-type perforating ohmic contact 20, a metal with a larger work function, such as nickel and/or palladium can be used.

Subsequently, the semiconductor structure 11 and metal can be annealed. The annealing can be performed using a set of conditions configured to ensure formation of a set of metal protrusions laterally penetrating the semiconductor layer 14 from the perforating elements 24. In an embodiment, the set of annealing conditions includes a temperature less than or equal to 850 degrees Celsius for forming a metal contact to a group III nitride semiconductor layer. In a more particular embodiment, the annealing includes rapid thermal annealing lasting for about a minute at about 600 degrees Celsius, followed by four to eight minute annealing at about 400 degrees Celsius. The annealing can be carried in an $N_2$ atmosphere.

In an embodiment, the annealing is configured to control a complexity and/or direction of the metal protrusions extending from a perforating element 24. For example, use of a relatively high temperature rapid annealing, where temperatures can reach up to approximately 850 degrees Celsius for a duration of less than a minute, can result in metal protrusions that extend laterally throughout the two dimensional carrier gas. In a more particular embodiment, rapid annealing lasting approximately forty-five seconds was used to obtain a desired set of metal protrusions.

A perforating element 24 can have a shape and/or a dimension, which varies with the depth of the perforating element 24. The variation can be a result of the etching process and/or the formation of the set of metal protrusions. The set of metal protrusions can be conducive to field emission and/or field-enhanced thermionic emission. Furthermore, a characteristic lateral size of the metal protrusions can be at least one half the Bohr radius in the semiconductor layer 12 and/or the two-dimensional carrier gas 16 (if present). In an embodiment, the characteristic lateral size also is less than the characteristic length scale.

While aspects of the invention are shown and described in conjunction with a device having a two-dimensional carrier gas 16, it is understood that aspects of the invention can be applied to devices without a two-dimensional carrier gas 16. In this case, the perforating ohmic contact 20 also can reduce overall contact resistance due to an increased perimeter of the ohmic electrode and an increased current around the sharp edges of the electrode protrusions. Furthermore, embodiments of the invention can be utilized in semiconductor devices containing multiple two-dimensional carrier gas regions.

In any event, as described herein, a characteristic length scale can be selected based on a sheet resistance of the semiconductor layer 14 and a contact resistance per unit length of a metal to be used for the perforating ohmic contact 20. FIGS. 3A and 3B show side and perspective views, respectively, of an illustrative perforating element 24 in a semiconductor structure 11 according to an embodiment. As illustrated, the perforating element 24 extends through the semiconductor layer 14 and the two-dimensional carrier gas 16, and partially extends into the semiconductor layer 12. As a result, the perforating element 24 has a contact area 40 with the two-dimensional carrier gas 16. A specific resistance between the metal of the perforating element 24 and the two-dimensional carrier gas 16, $R_m$, can be measured in units of Ohm×meters. A resistance of the two-dimensional carrier gas 16 per square, $R_{sh}$, and can be measured in Ohms. The conductivity of the two-dimensional carrier gas 16 can account for a large portion of conductivity of semiconductor layer 12. The placement/spacing of the perforating elements 24 in the semiconductor structure 11 can comprise an optimization parameter, which can be selected to decrease a resistance of the corresponding perforating ohmic contact.

FIG. 4 shows an illustrative geometrical model for calculating a resistance of a perforating ohmic contact according to an embodiment. The model includes an electrode 42 comprising multiple blade like recessed electrode segments 44A-44D connected by a metal layer 46. The electrode segments 44A-44D can have the same potential applied thereto, a ground can be applied to an electrode 48, and the electrodes 44A-44D can be separated by a channel region 49.

Over a distance W, there are W/(d+x) electrodes 44A-44D, where d is a thickness of an electrode 44A-44D, and x is a distance between two adjacent electrodes 44A-44D. A perimeter of each electrode 44A-44D is given by P=2(L+d) with L being a length of an electrode 44A-44D. An area of an individual electrode 44A-44D is given by A=L·d. A total perimeter of all electrodes 44A-44D is $P_T$=2(L+d)·W/(d+x). A total resistance of the system of electrodes 44A-44D is given by $R_C=R_m/P_T+R_{sh}·L/(x·W/(d+x))$. The expression of $R_C$ can be simplified to yield:

$$R_C = \frac{R_m(d+x)}{2W(L+d)} + R_{sh}\left(\frac{L}{W}\right)\left(1 + \frac{d}{x}\right)$$

The resistance $R_C$ has minima at a value of x given by x=$\sqrt{CR_{sh}AP/R_m}$, where C is a constant that depends on a shape of the electrode 44A-44D and is on the order of unity. This value can be used to select a characteristic length scale for spacing the cavities, and therefore the corresponding perforating elements, as described herein. For example, for an electrode having a length L of 10 μm and a width d of 1 μm, and for a $R_{sh}$=260Ω, and a $R_m$=1 Ω·mm, x~8 μm using the formula above. Although the derivation has been shown and described with respect to rectangular protrusions, the same result is qualitatively applicable for a great variety of shapes for the perforating elements as indicated in the inset of FIG. 4. While a single column of electrodes 44A-44D (or contact pads) is illustrated in FIG. 4, it is understood that several columns of electrodes can be employed forming an array of electrodes.

Figure 5:
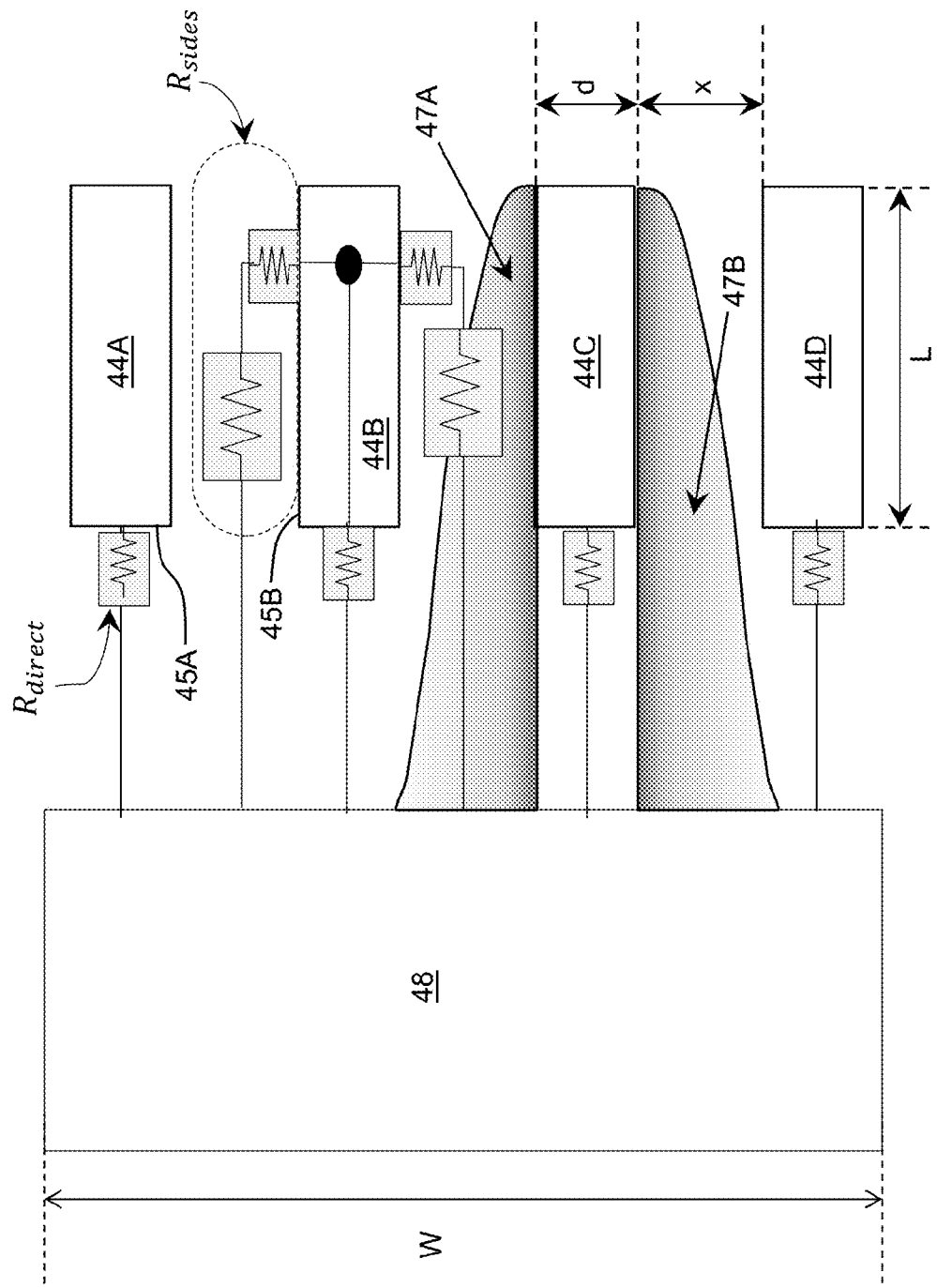
FIG. 5 shows an illustrative equivalent electrical circuit diagram of the geometrical model of FIG. 4 according to an embodiment.

In an embodiment, the perforating ohmic contact is an essentially linear contact. To this extent, an embodiment provides a solution for selecting one or more attributes of the perforating ohmic contact to provide the essentially linear behavior. FIG. 5 shows an illustrative equivalent electrical circuit diagram of the geometrical model of FIG. 4 according to an embodiment. As shown in FIG. 5, a direct resistance, $R_{direct}$, corresponds to a resistance between the front face 45A of the perforating ohmic contact (e.g., including each electrode 44A-44D) and the two-dimensional carrier gas. The resistance $R_{direct}$ can be written as a specific resistance, $R_m$, which can correspond to a resistance per unit length of the contact at the contact-to-two dimensional gas interface (e.g., measured in Ohm×m) divided by the total length of the frontal contact edge: d×N, where N is the number of electrodes 44A-44D, and d is the frontal length of a single electrode 44A-44D. Thus $R_{direct}=R_m/(d×N)$, with N=W/(d+x), where x is a distance between two adjacent electrodes 44A-44D and W being the width of the structure as shown in the FIG. 5. While the above formula assumes that the various electrodes 44A-44D have frontal contact edges of the same length, d, and are separated by the same distance x, it is understood that the formulas can be readily modified to account for electrodes 44A-44D having varying lengths, d, and/or separation distances x.

A side resistance, $R_{sides}$, for the contact corresponds to a total resistance for current to exit the sides 45B of each electrode 44A-44D forming the perforating ohmic contact. The side resistance can be calculated by: $R_{sides} \sim R_m/(2LN) + (R_{sh} L)/(f \times N)$, where the first term, $R_m/(2LN)$, similar to direct resistance, is a resistance at the side 45B of the contact (e.g., each side of each electrode 44A-44D) at the contact-to-two dimensional gas interface, and $(R_{sh} L)/(f \times N)$ is the resistance due to a resistance of the two dimensional gas in the space between the electrodes 44A-44D, where $R_{sh}$ is the sheet resistance of the two dimensional gas and L being a length of an electrode 44A-44D. The current around a contact pad has a finite spreading, as indicated schematically by the spreading domains 47A and 47B. Therefore, a factor f is introduced with values in the range of 0<f<1 to account for finite spreading. For example, if only small spreading is observed, the factor f is close to zero. However, for large spreading, the factor f can be close to 1. While the above formula assumes that the various electrodes 44A-44D have the same length, L, and are separated by the same distance x, it is understood that the formula can be readily modified to account for electrodes 44A-44D having varying lengths, L, and/or separation distances x.

The entire resistance of the set of electrodes 44A-44D forming the contact, $R_c$, can be written as: $R_c(x; d, f, L, R_m, R_{sh}) = 1/(1/R_{direct} + 1/R_{sides})$, where the explicit dependence on the electrode width d, electrode separation x, electrode length L, as well as physical factors such as $R_m$—specific resistance at the contact and two dimensional gas interface, and $R_{sh}$—the sheet resistance of two dimensional gas, are indicated. The expression for $R_c$ can be further simplified by introducing non-dimensionalization as:

$$x = x^* d, \ W = W^* d, \ L = L^* d, \ R_m = R_m^* d, \ R_{sh} = R_{sh}^* R_m^*.$$

Here, $x^*$, $W^*$, $L^*$ are unitless, $R_m^*$ has units of Ohm, and $R_{sh}^*$ is also unitless. Substituting non-dimensional quantities into the formula above results in:

$$R_c = R_m^* \left[ \frac{1 + x^*}{W^*} \right] \left[ \frac{1}{1 + \frac{2fL^* x^*}{fx^* + 2R_{sh}^* L^{*2}}} \right].$$

The expression above has a minima for a set of values of $x^*$, f, $L^*$, and $R_{sh}$. For example, FIGS. 6A-6C illustrate the dependence of normalized contact resistance, $R_c W/R_m$, on the length of the contact as a function of various parameters. FIG. 6A shows the dependence of the normalized contact resistance on the length of the contact for several values of the parameter f, with $x^*=5$, $R_{sh}=1$. As expected, the normalized contact resistance increases with a decreased value of f. Similar behavior is observed in FIG. 6B, where dependence of normalized contact resistance on the length of the contact for several values of the parameter $R_{sh}$ is shown for $x^*=5$, f=0.8. FIG. 6C shows that the optimal contact length $L^*$ should be smaller than the contact separation distance $x^*$ for the minima in normalized contact resistance to be present.

Figure 7A:
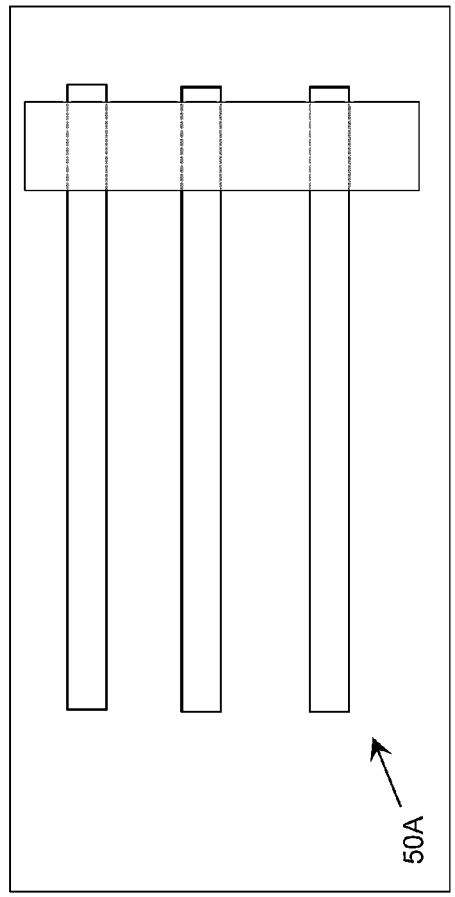
FIGS. 7A-7C show illustrative arrangements of perforating elements according to embodiments.
Figure 7C:
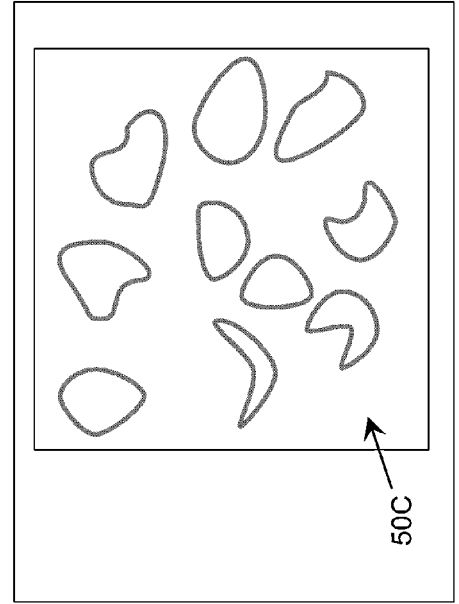
Figure 7B:
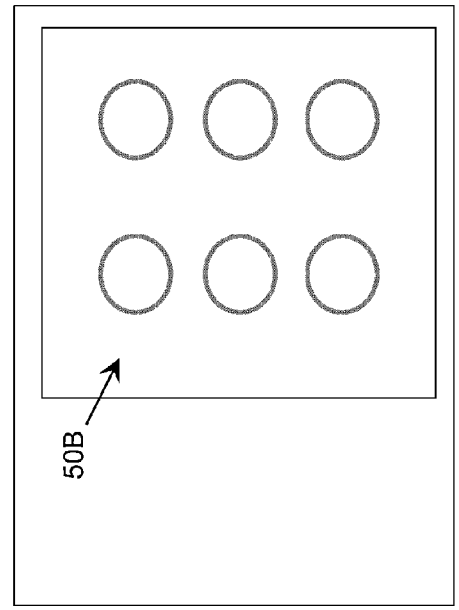

The perforating elements 24 (FIG. 1A) of a perforating ohmic contact 20 (FIG. 1A) can be arranged in any of various types of patterns. For example, FIGS. 7A-7C show illustrative arrangements 50A-50C of perforating elements according to embodiments. In FIG. 7A, the arrangement 50A includes perforating elements formed in a blade arrangement, in which each perforating element is an elongate member located in parallel with the other perforating elements. In FIG. 7B, the arrangement 50B includes cylindrical perforating elements formed in a rectangular array. In FIG. 7C, the arrangement 50C includes perforating elements of different, irregular shapes and having an irregular distribution. It is understood that these arrangements 50A-50C are only illustrative of various types of arrangements that can be utilized in embodiments of the perforating ohmic contact.

Figure 8A:
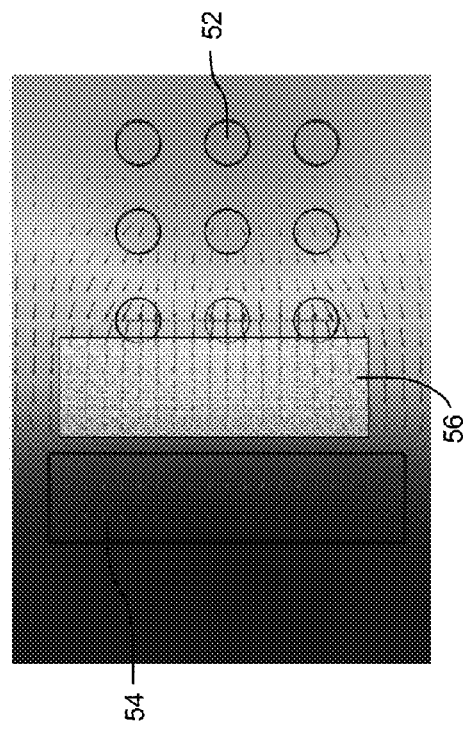
FIGS. 8A-8C show illustrative modeling of current flow and distribution of potential for an array of electrodes according to an embodiment.
Figure 8C:
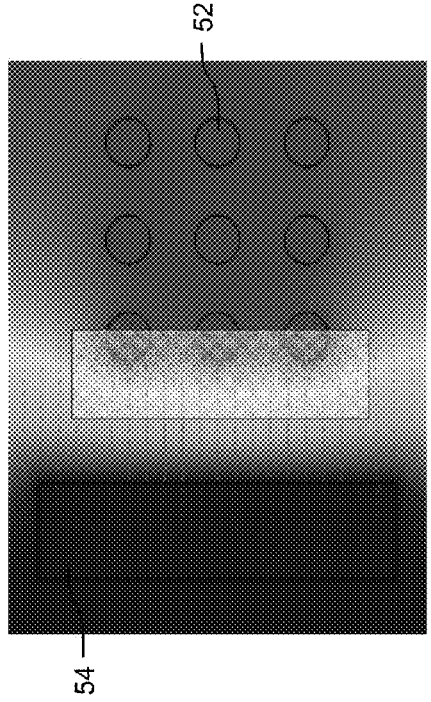
Figure 8B:
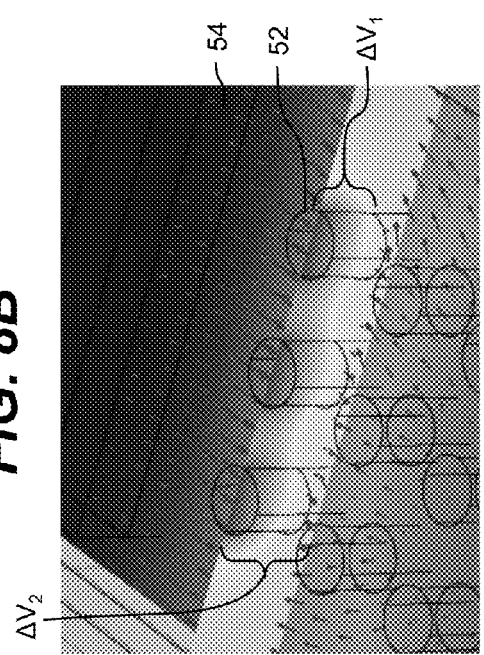

FIGS. 8A-8C show illustrative modeling of current flow and distribution of potential for an array of electrodes according to an embodiment. As illustrated, nine cylindrical electrodes 52 are placed in a three by three array arrangement and penetrate a two-dimensional electron gas. To simplify the model, all other layers are assumed to be non-conducting. In each case, each cylindrical electrode 52 has the same potential voltage and a ground is applied to the electrode 54. FIG. 8A shows the resulting current flow. As illustrated, current crowding occurs near the first row of electrodes in the region 56. FIG. 8B shows a distribution of potential, and FIG. 8C shows a current distribution for a less conductive two-dimensional electron gas.

Current crowding is a function of a conduction of the region containing the two-dimensional electron gas. As shown in FIG. 8C, current crowding significantly increases with a decreasing conductivity of the two-dimensional electron gas region. To this extent, in FIG. 8C, electrodes placed in the second and third row contribute little to the overall contact as most of the current flows from the first row of electrodes. Additionally, the potential has little variation between the first and second rows and virtually no variation between the second and third rows of electrodes. Furthermore, as illustrated in FIG. 8B, while there is a change in potential $\Delta V_1$, being the potential drop over an electrode between the applied voltage and the two-dimensional electron gas, this change in potential is smaller than a change in potential $\Delta V_2$, being the potential drop between the applied voltage and the neighboring two-dimensional electron gas region. The resultant current has a tendency to flow around the electrodes, as can be seen in FIGS. 8A and 8B. From the above simulations, it can be seen that the electrode design can be based on the conductive properties of the materials, for example, on the conductive properties of two-dimensional electron gas. For instance, for low conductive two-dimensional electron gas only the first and perhaps second row of electrodes may be important.

Figure 9A:
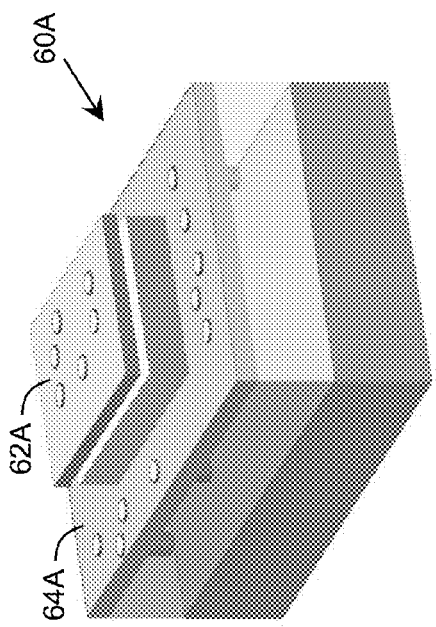
FIGS. 9A-9C show illustrative light emitting diodes according to embodiments.
Figure 9C:
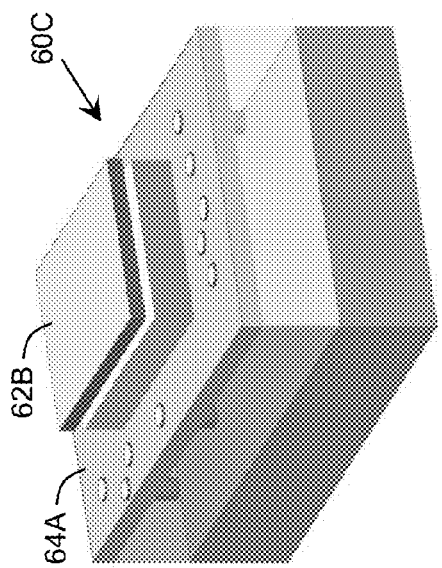
Figure 9B:
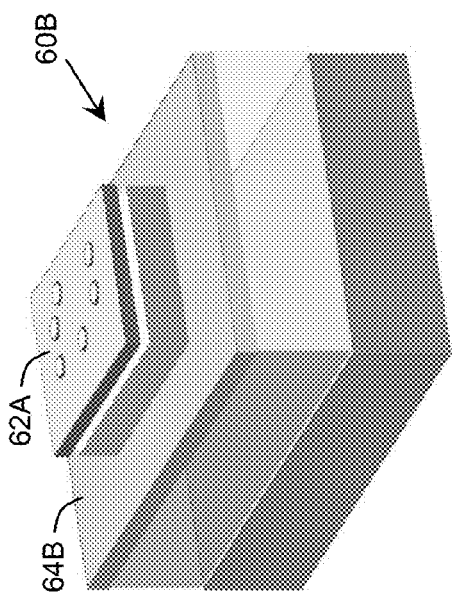

As described herein, an embodiment of a perforating ohmic contact can be utilized as an n-type or a p-type contact in various types of devices. For example, FIGS. 9A-9C show illustrative light emitting diodes 60A-60C according to embodiments. In FIG. 9A, the light emitting diode 60A includes both a p-type contact 62A and an n-type contact 64A, which are embodiments of a perforating ohmic contact described herein. In FIG. 9B, the light emitting diode 60B includes a p-type perforating ohmic contact 62A, while the n-type contact 64B can comprise a regular annealed contact. In FIG. 9C, the light emitting diode 60C includes an n-type perforating ohmic contact 64A, while the p-type contact 62B can comprise a regular annealed contact.

Figure 10A:
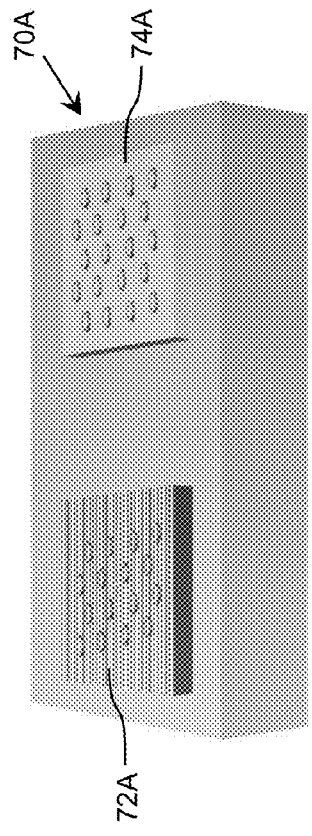
FIGS. 10A-10C show illustrative transistors according to embodiments.
Figure 10B:
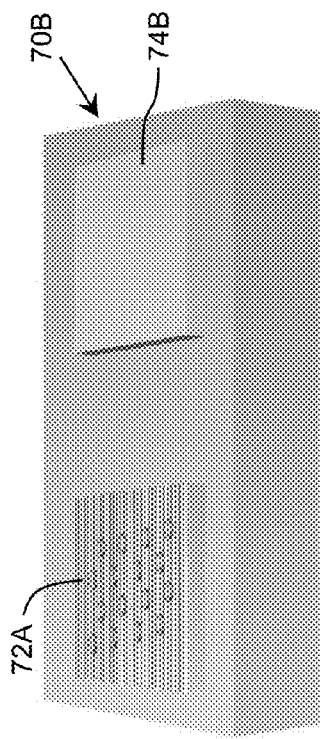
Figure 10C:
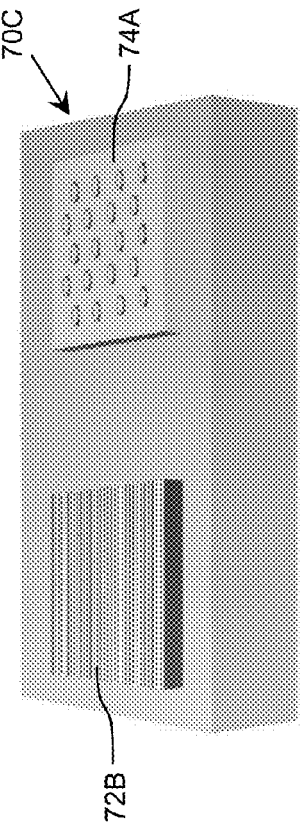

Similarly, FIGS. 10A-10C show illustrative transistors 70A-70C according to embodiments. In FIG. 10A, the transistor 70A includes both a source 72A and a drain 74A, which are embodiments of a perforating ohmic contact described herein. In FIG. 10B, the transistor 70B includes a perforating ohmic source contact 72A, while the drain 74B can comprise a regular annealed contact. In FIG. 10C, the transistor 70C includes a perforating ohmic drain contact 74A, while the source 72B can comprise a regular annealed contact.

It is understood that the configurations of the perforating ohmic contacts shown in FIGS. 9A-9C and 10A-100 are only illustrative. For example, a single contact can include a portion including perforating elements and a second portion comprising a regular annealed metallic electrode. In addition, one or more regions of a regular annealed electrode can be recessed into the underlying semiconductor layer(s) thereby forming a large area perforating element. Furthermore, it is understood that a light emitting device and a transistor are only illustrative of various types of devices that can include a perforating ohmic contact. For example, illustrative devices include, but are not limited to, a laser diode, a photodiode, a photomultiplier, a PIN diode, a Schottky diode, and/or the like.

As discussed herein, a perforating ohmic contact may or may not penetrate a two-dimensional carrier gas. To this extent, FIGS. 11A and 11B show side views of an illustrative light emitting device 80 and an illustrative transistor 82 according to embodiments. As illustrated, the light emitting device 80 can include perforating ohmic contacts 84 that penetrate one or more of the underlying semiconductor layers. However, there is no two-dimensional carrier gas below the perforating ohmic contacts 84. The transistor 82 includes a perforating ohmic contact 86 that penetrates one or more of the underlying semiconductor layers as well as a two-dimensional carrier gas 88 located there below.

Figure 12A:
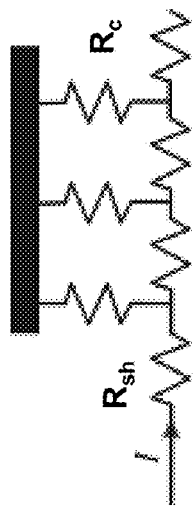
FIGS. 12A-12E illustrate the evaluation of the corresponding resistivities.
Figure 12B:
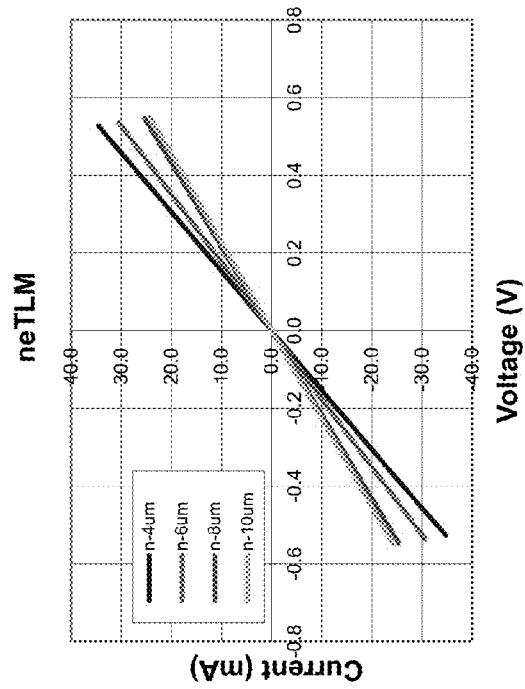
Figure 12C:
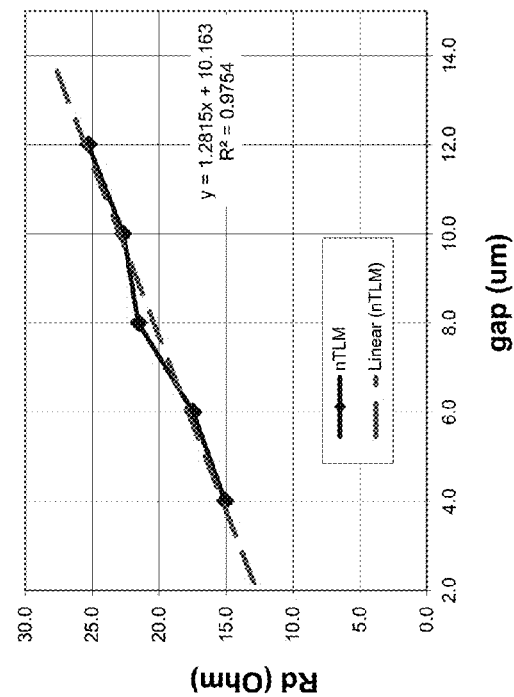
Figure 12D:
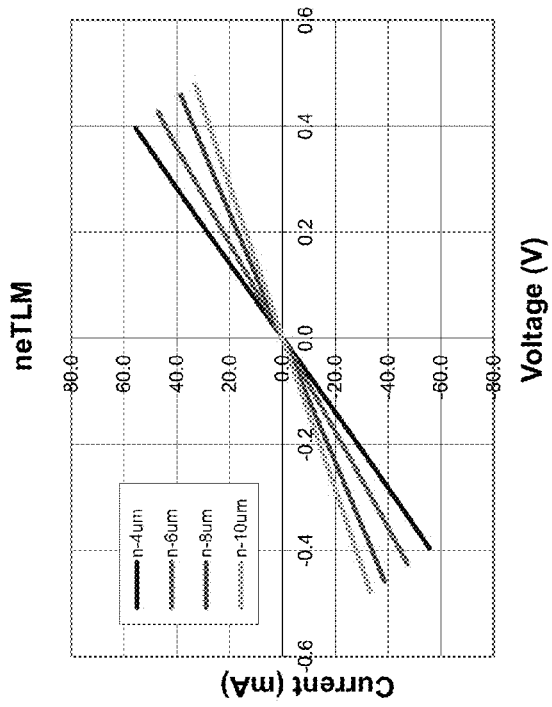
Figure 12E:
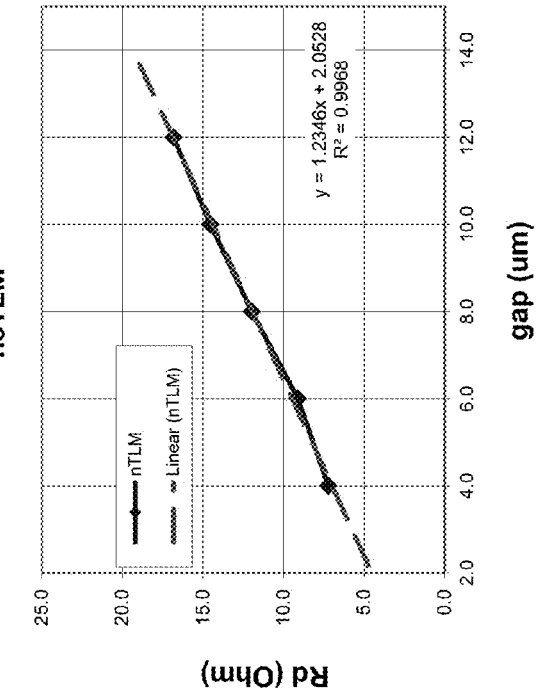

Illustrative perforating ohmic contacts described herein and regular ohmic contacts were fabricated and the corresponding resistivities were evaluated. FIGS. 12A-12E illustrate the evaluation of the corresponding resistivities. As shown in FIG. 12A, a semiconductor device includes two main resistances, the contact resistance, $R_C$, and the semiconductor resistance, $R_{SH}$. The contact resistance can be measured in $\Omega \cdot mm$, while the semiconductor resistance can be given per square in units of $\Omega/sq$. FIGS. 12B and 12C show TLM measurements for the regular ohmic contacts, while FIGS. 12D and 12E show TLM measurements for the perforating ohmic contacts. As can be determined from these measurements, an overall contact resistance is significantly decreased for the perforating ohmic contacts as compared to the regular ohmic contacts, e.g., from $1 \ \Omega \cdot mm$ to $0.21 \ \Omega \cdot mm$. Additionally, the semiconductor resistance slightly decreased for the perforating ohmic contacts as compared to the regular ohmic contacts, e.g., from $256 \ \Omega/sq$ to $246 \ \Omega/sq$.

Figure 13:
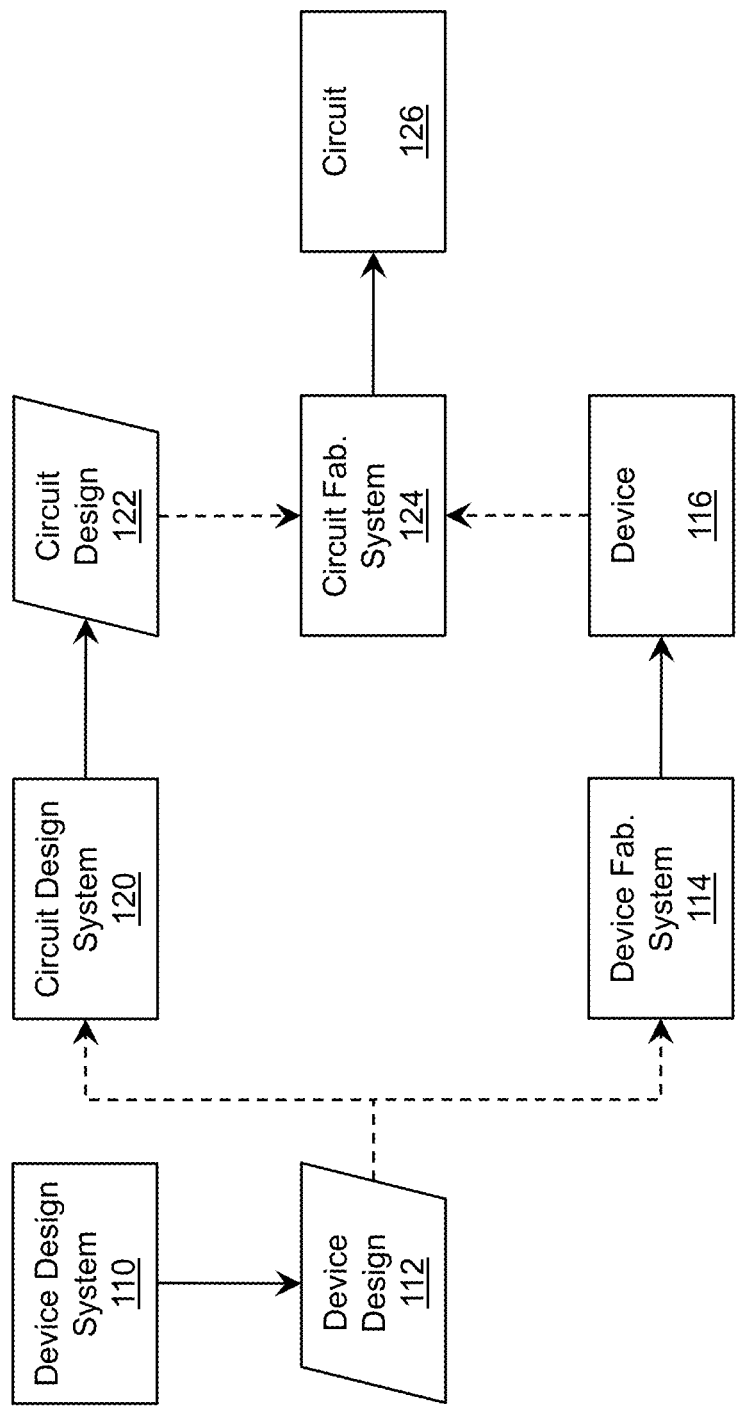
FIG. 13 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 13 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method comprising:
fabricating a perforating contact to a semiconductor layer in a semiconductor structure, the fabricating including:
   forming a plurality of cavities in the semiconductor structure, wherein the plurality of cavities are separated from each other by a characteristic length scale;
   depositing a metal into the plurality of cavities and over an area of the semiconductor structure including the plurality of cavities; and
   annealing the semiconductor structure and the metal using a set of conditions configured to ensure formation of a set of metal protrusions laterally penetrating the semiconductor layer from at least one of the plurality of cavities.

2. The method of claim 1, wherein the set of metal protrusions have a characteristic lateral size, wherein the characteristic lateral size is at least one half the Bohr radius in at least one of: the semiconductor layer or a two-dimensional carrier gas region in the semiconductor structure, and wherein the characteristic lateral size is less than the characteristic length scale.

3. The method of claim 1, wherein the fabricating results in a perforating contact including a plurality of perforating elements corresponding to the plurality of cavities, each of the plurality of perforating elements having a set of sharp edges.

4. The method of claim 3, wherein the plurality of perforating elements have at least one of: a shape or a dimension that varies based on a depth of the perforating element.

5. The method of claim 1, wherein the semiconductor structure comprises a group III nitride based semiconductor structure including:
   a first group III nitride layer;
   a second group III nitride layer; and
   a two-dimensional carrier gas formed at a junction of the first and second group III nitride layers.

6. The method of claim 5, wherein the forming the plurality of cavities results in cavities extending through the first group III nitride layer and at least partially through the second group III nitride layer.

7. The method of claim 5, wherein the annealing is performed at a temperature less than or equal to approximately 850 degrees Celsius.

8. The method of claim 1, further comprising calculating a target characteristic length scale for the plurality of cavities based on a sheet resistance of the semiconductor layer, an area of the cavity, a perimeter of the cavity, and a contact resistance per unit length of the metal of the perforating contact.

9. The method of claim 1, wherein the semiconductor structure further includes at least one layer of low conductive or isolating material, and wherein the plurality of cavities extend through the at least one layer of low conductive or isolating material.

10. The method of claim 1, wherein the characteristic length scale is selected based on a sheet resistance of the semiconductor layer and a contact resistance per unit length of the metal of the perforating contact contacting the semiconductor layer.

11. A method of fabricating a device, the method comprising:
forming a perforating contact to a semiconductor layer in a semiconductor structure, the perforating contact including:
   a plurality of perforating elements formed of a metal deposited in a plurality of cavities in the semiconductor structure, wherein at least one of the plurality of perforating elements includes a set of metal protrusions extending from the cavity and laterally penetrating the semiconductor layer; and
   a top layer of the metal located over an area of the semiconductor structure including the plurality of cavities,
wherein the forming includes:
   forming the plurality of cavities in the semiconductor structure, wherein the plurality of cavities are separated from each other by a characteristic length scale selected based on a sheet resistance of the semiconductor layer and a contact resistance per unit length of the metal;
   depositing the metal into the plurality of cavities and over an area of the semiconductor structure including the plurality of cavities; and
   annealing the semiconductor structure and the metal using a set of conditions configured to ensure formation of the set of metal protrusions.

12. The method of claim 11, wherein the set of metal protrusions have a characteristic lateral size, wherein the characteristic lateral size is at least one half the Bohr radius in at least one of: the semiconductor layer or a two-dimensional carrier gas region in the semiconductor structure, and wherein the characteristic lateral size is less than the characteristic length scale.

* * * * *